United States Patent [19]

Matsumoto et al.

[11] Patent Number: 5,369,792
[45] Date of Patent: Nov. 29, 1994

[54] AGC CIRCUIT OF FM FRONT-END PORTION FOR CONTROLLING BANDWIDTH DETECTION SENSITIVITY

[75] Inventors: Yutaka Matsumoto, Yokohama; Nozomu Kawada, Tokyo, both of Japan

[73] Assignee: Kabushiki Kaisha Toshiba, Kawasaki, Japan

[21] Appl. No.: 725,522

[22] Filed: Jul. 3, 1991

[30] Foreign Application Priority Data

Jul. 3, 1990 [JP] Japan .................. 2-174509

[51] Int. Cl.$^5$ .............................................. H04B 1/16
[52] U.S. Cl. ............................ 455/245.1; 455/246.1; 455/249.1; 230/284
[58] Field of Search ............ 455/234.1, 245.1, 246.1, 455/247.1, 249.1, 250.1; 330/284

[56] References Cited

U.S. PATENT DOCUMENTS

| | | | |
|---|---|---|---|
| 4,030,035 | 6/1977 | Ienaka et al. | 455/246.1 X |
| 4,538,300 | 8/1985 | Richards, Jr. | 455/245.1 X |
| 4,955,073 | 9/1990 | Sugayama | 455/249.1 X |
| 4,955,077 | 9/1990 | Sugayama | 455/247.1 X |
| 5,175,883 | 12/1992 | Ueno | 358/174 |

Primary Examiner—Edward F. Urban
Attorney, Agent, or Firm—Oblon, Spivak, McClelland, Maier & Neustadt

[57] ABSTRACT

According to this invention, there is disclosed an AGC circuit of an FM front-end portion, including an attenuator for attenuating an input signal in accordance with a level of a first signal, an amplifier for amplifying the input signal in accordance with a level of a second signal, a first input amplitude control circuit for outputting third and fourth signals in accordance with a receiving electric field strength of a receiver, a receiving electric field detecting circuit for outputting a fifth signal in accordance with an amplitude of an IF signal in the receiver, and a second input amplitude control circuit for adjusting levels of the first and second signals by changing the third and fourth signals in accordance with the fifth signal.

2 Claims, 5 Drawing Sheets

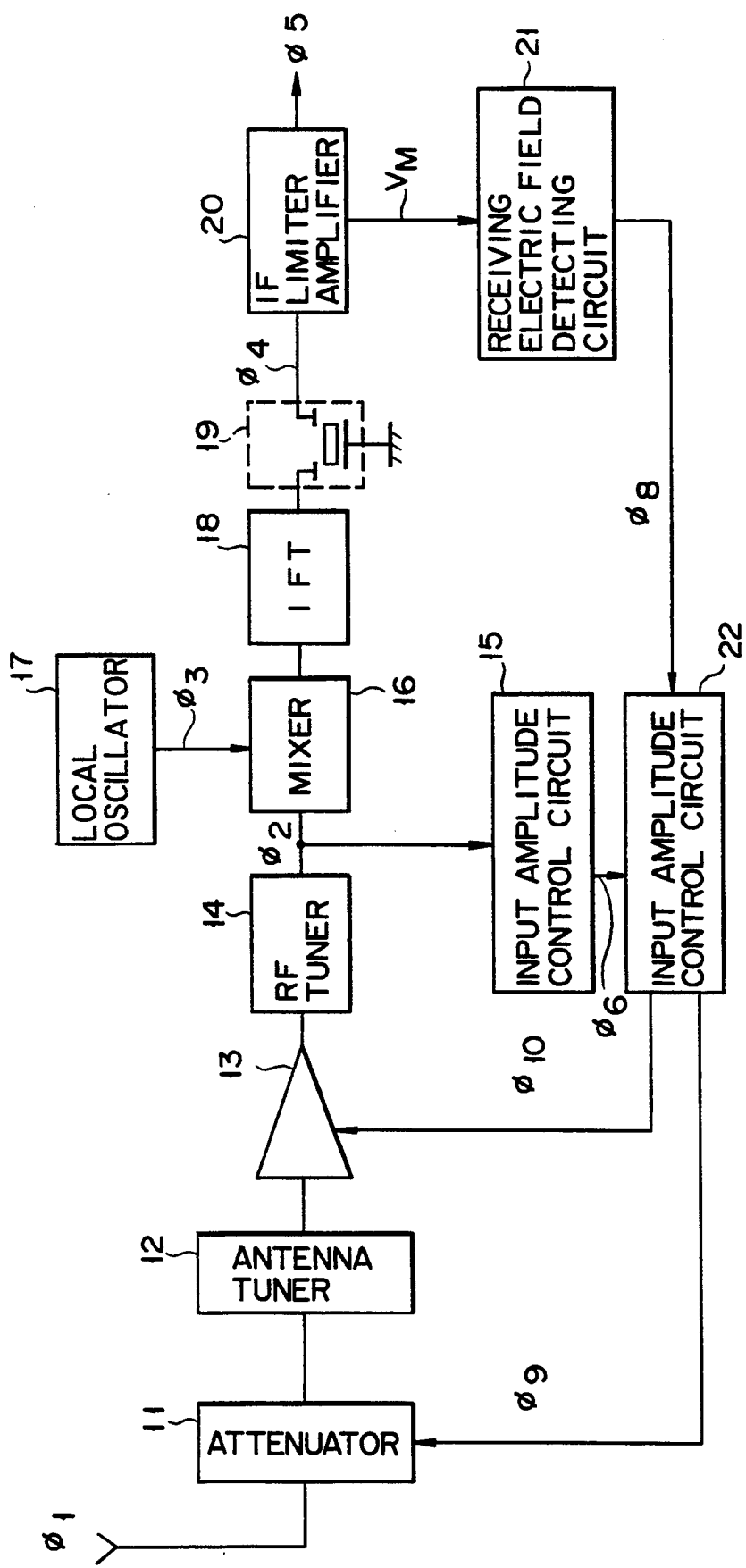
F I G. 3

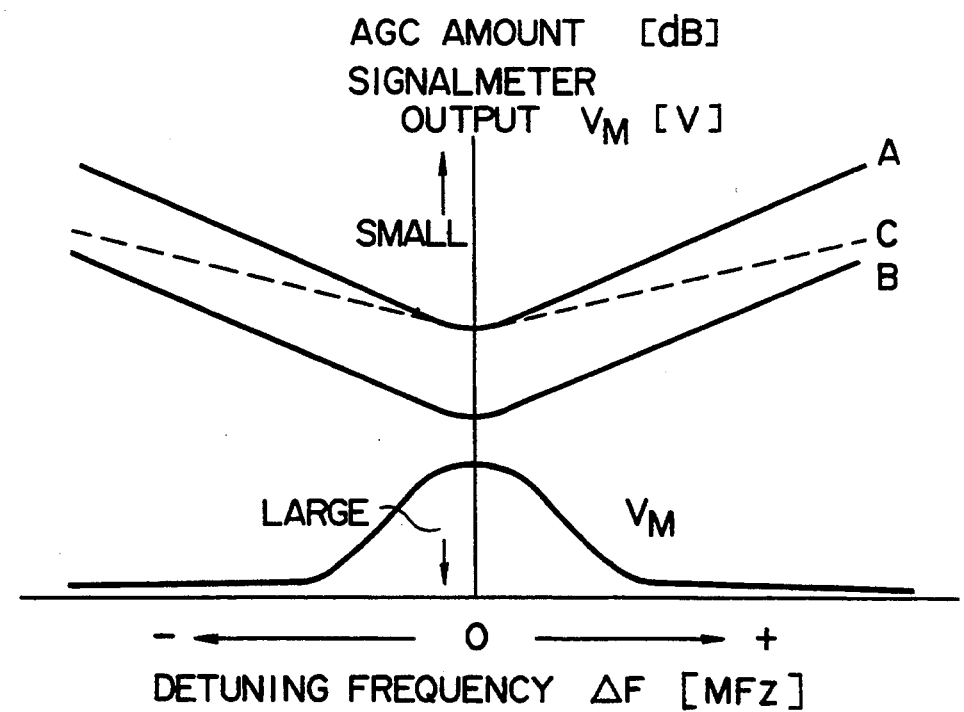
F I G. 4
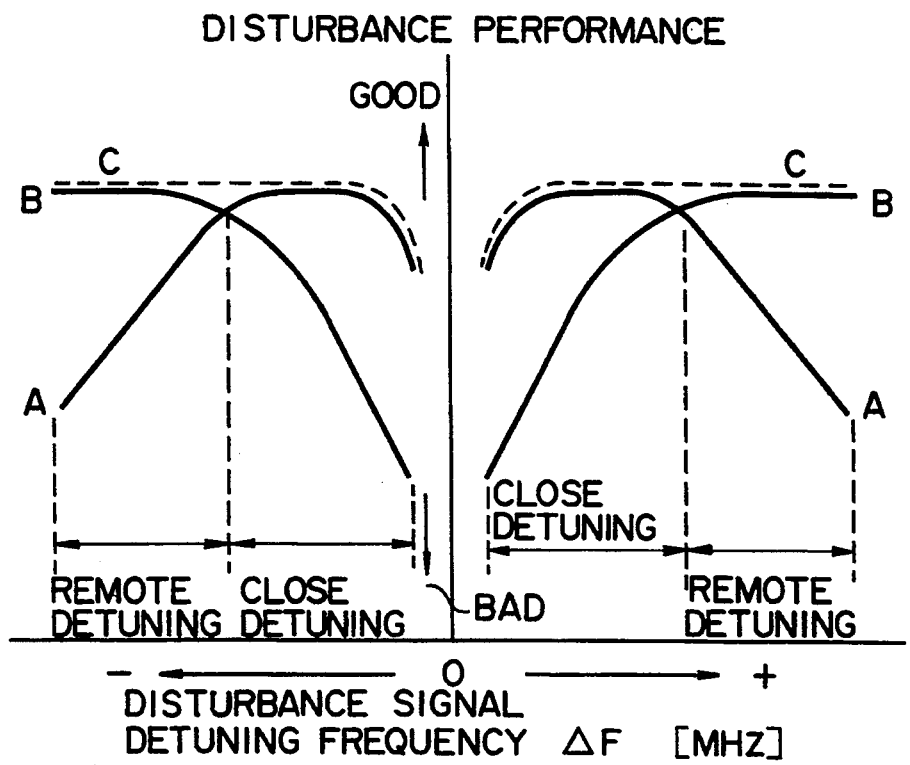
F I G. 5

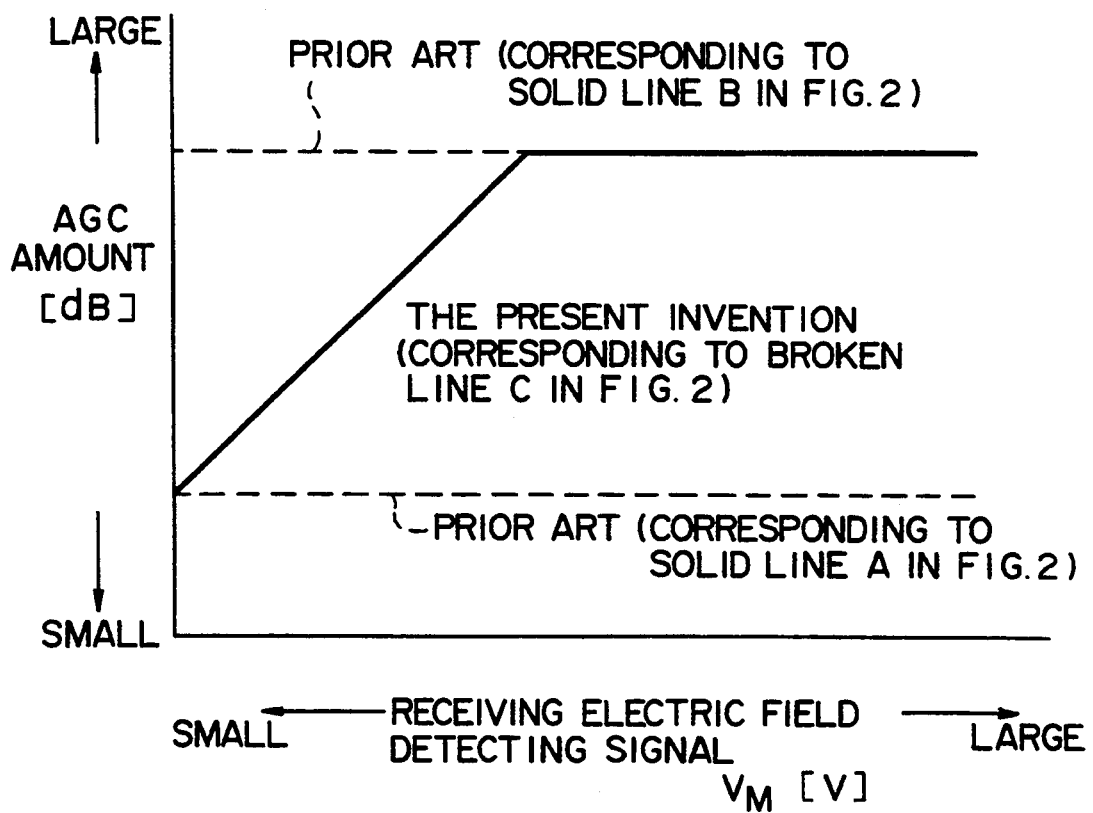
F I G. 6

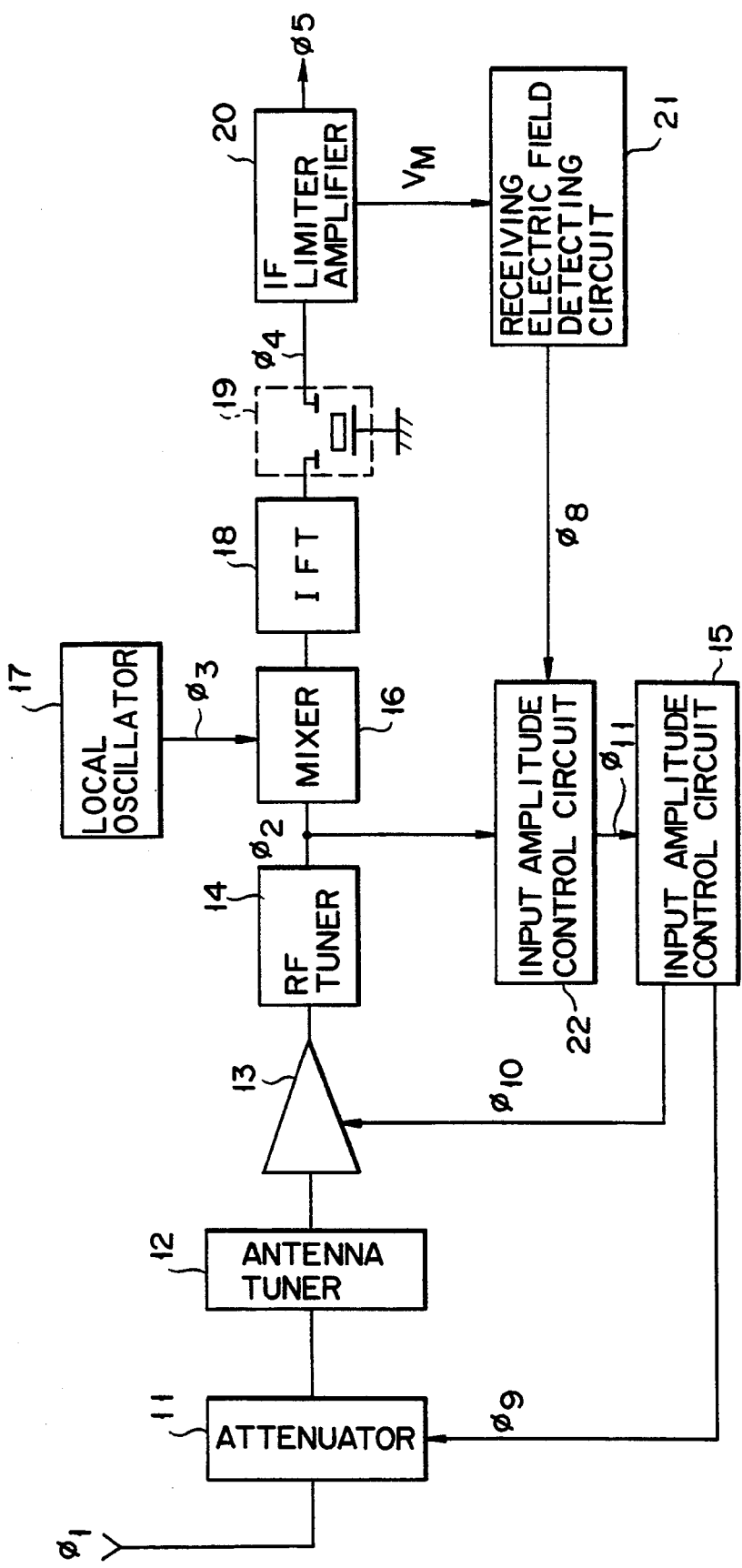
F I G. 7

AGC CIRCUIT OF FM FRONT-END PORTION FOR CONTROLLING BANDWIDTH DETECTION SENSITIVITY

BACKGROUND OF THE INVENTION

1. Field of the Invention

The present invention relates to an AGC (Automatic Gain Control) circuit of an FM front-end portion and, more particularly, to an AGC circuit of an FM front-end portion used in an FM tuner of mobile audio equipment.

2. Description of the Related Art

An AGC circuit of an FM front-end portion is generally operated by receiving an input signal having an amplitude exceeding an AGC sensitivity, and an AGC amount is determined in accordance with a difference between the AGC sensitivity and the input amplitude.

The frequency characteristics of the AGC amount are shown in FIG. 1. For this reason, as shown in disturbance performance characteristics (when the AGC amount has the frequency characteristics in FIG. 1) in FIG. 2, when the AGC sensitivity is set to obtain improved disturbance performance in a close-detuning range, the AGC amount is very small (a solid line A in FIG. 1) in a remote-detuning range. As a result, the disturbance performance in the remote-detuning range is degraded (a solid line A in FIG. 2). In addition, when the AGC sensitivity is set to obtain improved disturbance performance in the remote-detuning range, since the AGC amount is too large in the close-detuning range, the disturbance performance in the close-detuning range is degraded (a solid line B in FIG. 2).

As described above, according to the conventional technique, since a trade-off relationship between the disturbance performance in the close-detuning range and the disturbance performance in the remote-detuning range is established, when one disturbance performance is improved, the other is degraded.

Summary of the Invention

The present invention has been made to solve the above drawback, and has as its object to provide an AGC circuit of an FM front-end portion capable of obtaining improved disturbance performance in both close- and remote-detuning ranges by making an AGC amount of the AGC circuit of the FM front-end portion to be changeable.

According to the present invention, there is provided an AGC circuit of an FM front-end portion, comprising a first input amplitude control circuit for outputting third and fourth signals in accordance with a level of a receiving electric field strength of a receiver having an attenuator for attenuating an input signal in accordance with a level of a first signal and an amplifier for amplifying the input signal in accordance with a second signal, a receiving electric field detecting circuit for outputting a fifth signal in accordance with an amplitude of an IF signal in the receiver, and a second input amplitude control circuit for outputting the first and second signals by changing the third and fourth signals in accordance with the fifth signal.

With the above arrangement, an AGC amount of the AGC circuit of the FM front-end portion is changed in accordance with the amplitude of the IF signal. For this reason, the AGC amount can be set to obtain improved disturbance performance in close- and remote-detuning ranges. That is, the improved disturbance performance can be obtained in both the close- and remote-detuning ranges.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

Brief Description of the Drawings

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a block diagram showing a principle of an AGC circuit of an FM front-end portion according to the first embodiment of the present invention;

FIG. 4 is a graph showing a relationship between a detuning frequency and an AGC amount of an AGC circuit according to the first embodiment of the present invention;

FIG. 5 is a graph showing disturbance characteristics of the AGC circuit according to the first embodiment of the present invention;

FIG. 6 is a graph showing a relationship between a signal meter output $V_M$ and an AGC amount of the AGC circuit according to the first embodiment of the present invention; and FIG. 7 is a block diagram showing a principle of an AGC circuit of an FM front-end portion according to the second embodiment of the present invention.

DETAILED DESCRIPTION OF THE PREFERRED EMBODIMENTS

Figure 1:
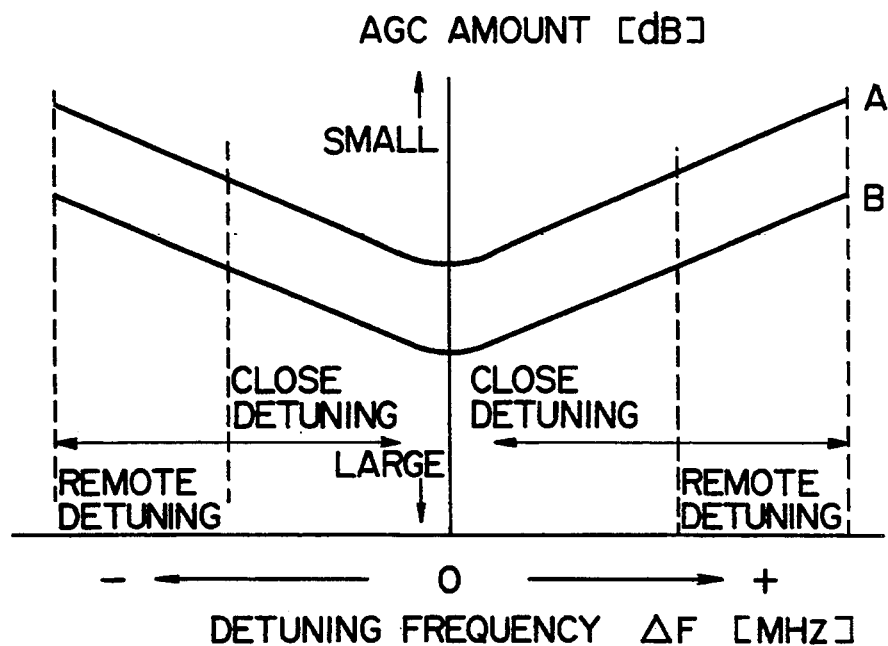
FIG. 1 is a graph showing a relationship between a detuning frequency and an AGC amount of a conventional AGC circuit.

An embodiment of the present invention will be described below with reference to the accompanying drawings.

FIG. 3 is a block diagram showing a principle of an AGC circuit of an FM front-end portion according to the first embodiment of the present invention.

A signal $\Phi_1$ of an FM wave from an antenna is input to an attenuator 11. At this time, since a control signal $\Phi_9$ from an input amplitude control circuit 22 is not received by the attenuator 11, the attenuator 11 is not operated. The signal $\Phi_1$ is input from the attenuator 11 to an antenna tuner 12. The antenna tuner 12 has frequency characteristics including a reception frequency as a center (a maximum frequency). Thereafter, the input signal is amplified by a high frequency amplifier 13. The amplified input signal is input to an RF tuner 14. The RF tuner 14 has frequency characteristics including a reception frequency as a center (a maximum frequency). A signal $\Phi_2$ output from the RF tuner 14 is input to a first input amplitude control circuit 15 and a mixer 16. In the mixer 16, the signal $\Phi_2$ from the RF tuner 14 is mixed with a signal $\Phi_3$ from a local oscillator (VCO) 17. An IF signal $\Phi_4$ is output from the mixer 16 through an intermediate tuning transformer IFT (coil)

18 and a CF (ceramic filter) 19. The IF signal $\Phi_4$ is input to an IF limiter amplifier 20, and an amplified IF signal $\Phi_5$ is output from the IF limiter amplifier 20.

In this case, when the level of the signal $\Phi_2$ output from the RF tuner 14 and input to the mixer 16 exceeds a constant level, i.e., a first predetermined threshold value, an attenuation control signal (the third signal) $\Phi_6$ is output from the first input amplitude control circuit 15, and the signal $\Phi_6$ is input to a second input amplitude control circuit 22. The first input amplitude control circuit 15 can change the level of the attenuation control signal $\Phi_6$ for determining an attenuation amount of the attenuator 11 and a gain amount of the amplifier 13 according to the level of the signal $\Phi_2$. The signal meter output voltage $V_M$ having a voltage value determined in accordance with the amplitude of the IF signal $\Phi_4$ is input from the IF limiter amplifier 20 to a receiving electric field detecting circuit 21, and a control signal (the fifth signal) $\Phi_8$ is output from the receiving electric field detecting circuit 21. The control signal $\Phi_8$ is input to the second input amplitude control circuit 22 such that the level of the attenuation control signal $\Phi_6$ can be adjusted. Therefore, the attenuation control signal (the first signal) $\Phi_9$ and the gain control signal (the second signal) $\Phi_{10}$ which are corrected as requested are output from the second input amplitude control circuit 22. The attenuation control signal $\Phi_9$ is input to the attenuator 11 to control the attenuation amount of the attenuator 11. In addition, a gain control signal $\Phi_{10}$ is input to the RF amplifier 13 to control the amplification amount of the high frequency amplifier 13.

With the above arrangement, the AGC amount of the AGC circuit of the FM front-end portion is changed such that the control signal $\Phi_8$ is changed in accordance with the amplitude of the signal meter output voltage $V_M$, i.e., the IF signal $\Phi_4$, of an FM IF portion. For this reason, as shown in FIG. 4, the AGC amount can be set (a broken line C in FIG. 4) to obtain improved disturbance performance in close- and remote-detuning ranges. As shown in FIG. 5, disturbance performance can be improved in the close- and remote-detuning ranges (a broken line C in FIG. 5). FIG. 6 shows a relationship between the signal meter output voltage $V_M$ of the FM IF portion and the AGC amount.

FIG. 7 is a view showing an AGC circuit of an FM front-end portion according to the second embodiment of the present invention. The same reference numerals as in FIG. 3 denote the same parts in FIG. 7, and a description thereof will be omitted.

When a signal $\Phi_2$ output from an RF tuner 14 and input to a mixer 16 exceeds a constant level, i.e., a predetermined threshold value, an attenuation control signal (the first signal) $\Phi_9$ is output from a first input amplitude control circuit 22 in accordance with the level of the signal $\Phi_2$. In addition, the signal $\Phi_9$ and a gain control signal (the second signal) $\Phi_{10}$ are output from the second input amplitude control circuit 15. In the second input amplitude control circuit 15, the level of the attenuation control signal $\Phi_9$ for determining the attenuation amount of the attenuator 11 and the level of the gain control signal $\Phi_{10}$ for determining the gain amount of an amplifier 13 can be changed. A signal meter output voltage $V_M$ having a voltage value determined in accordance with the amplitude of an IF signal $\Phi_4$ is input from an IF limiter amplifier 20 to a receiving electric field detecting circuit 21, and a control signal (the third signal) $\Phi_8$ is output from the control circuit 21. The signal $\Phi_8$ is input to a first input amplitude circuit 22. A control signal (the fourth signal) $\Phi_{11}$ for adjusting the level of the attenuation control signal $\Phi_9$ or the gain control signal $\Phi_{10}$ is output from the first input amplitude control circuit 22. That is, the attenuation control signal $\Phi_9$ and the gain control signal $\Phi_{10}$ can be adjusted in accordance with the control signal $\Phi_{11}$. Therefore, the attenuation control signal $\Phi_9$ and the gain control signal $\Phi_{10}$ which are corrected as needed are output from the first input amplitude control circuit 15. Note that the attenuation amount of the attenuator 11 is controlled by the attenuation control signal $\Phi_9$, and the amplification amount of the RF amplifier 13 can be controlled by the gain control signal $\Phi_{10}$.

The same effect as in the first embodiment can also be obtained with the above arrangement.

As described above, according to an AGC circuit of the FM front-end portion of the present invention, the following effect can be obtained.

An AGC amount of an AGC circuit of the FM front-end portion can be changed by a signal meter output of the FM IF portion. For this reason, the AGC amount can be set to obtain improved disturbance performance in the close-and remote-detuning ranges.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An AGC circuit of an FM front-end portion, comprising:

an attenuator for attenuating an input signal;

an amplifier for amplifying said input signal, said amplifier being connected, in series, to said attenuator;

first adjusting means for adjusting an attenuation amount of said attenuator and a gain amount of said amplifier in accordance with a level of a first signal output from said amplifier, said first adjusting means including a first input amplitude control circuit for outputting a second signal, a level of said second signal being controlled by said first input amplitude control circuit so as to determine said attenuation amount of said attenuator and said gain amount of said amplifier in accordance with a level of said first signal; and second adjusting means for receiving said second signal and for outputting a third signal to said attenuator and a fourth signal to said amplifier in accordance with the level of said second signal, and means for adjusting levels of said third and fourth signals thereby decreasing the attenuation amount of said attenuator and increasing the gain amount of said amplifier when the level of a signal meter output voltage having a voltage value determined in accordance with an amplitude of an IF signal is less than or equal to a predetermined threshold value, said second adjusting means including a second input amplitude control circuit for outputting said third and fourth signals.

2. An AGC circuit of an FM front-end portion, comprising:

an attenuator for attenuating an input signal;

an amplifier for amplifying said input signal, said amplifier being connected, in series, to said attenuator;

first adjusting means for adjusting an attenuation amount of said attenuator and a gain amount of said amplifier in accordance with a level of a first signal output from said amplifier, said first adjusting means including a first input amplitude control circuit for outputting a second signal, a level of said second signal being controlled by said first input amplitude control circuit so as to determine said attenuation amount of said attenuator and said gain amount of said amplifier in accordance with a level of said first signal; and second adjusting means for receiving said second signal and for outputting a third signal to said attenuator and a fourth signal to said amplifier in accordance with the level of said second signal, and means for adjusting levels of said third and fourth signals thereby decreasing an AGC sensitivity of said AGC circuit when the level of a signal meter output voltage having a voltage value determined in accordance with an amplitude of an IF signal is less than or equal to a predetermined threshold value, said second adjusting means including a second input amplitude control circuit for outputting said third and fourth signal.

* * * * *

UNITED STATES PATENT AND TRADEMARK OFFICE
CERTIFICATE OF CORRECTION

Figure 2:
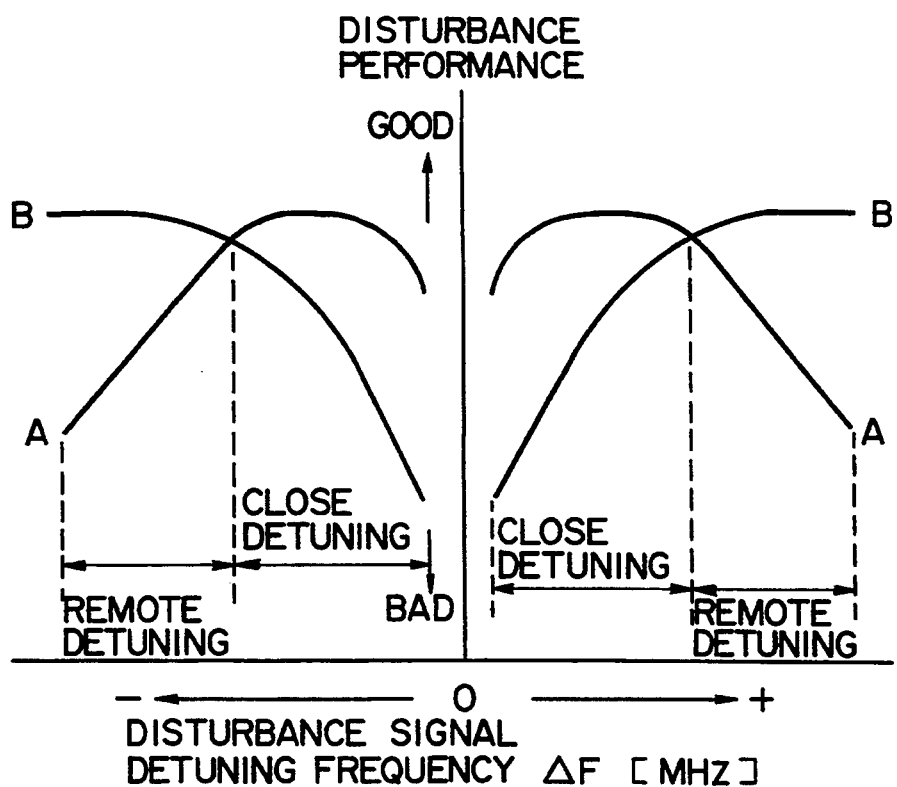
FIG. 2 is a graph showing disturbance characteristics when a conventional AGC circuit is used.

PATENT NO. : 5,369,792            Page 1 of 2
DATED : NOVEMBER 29, 1994
INVENTOR(S) : MATSUMOTO ET AL It is certified that error appears in the above-indentified patent and that said Letters Patent is hereby corrected as shown below:

In the Drawings:

delete Fig. 2, and replace with the attach Fig. 2.

Signed and Sealed this

Second Day of May, 1995

*Attest:*

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,369,792
DATED : NOVEMBER 29, 1994
INVENTOR(S) : MATSUMOTO ET AL

It is certified that error appears in the above-indentified patent and that said Letters Patent is hereby corrected as shown below:

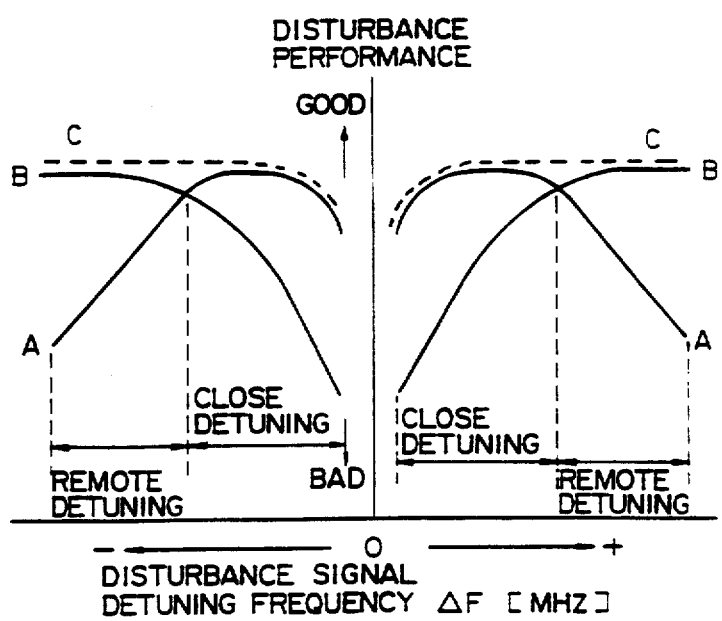

FIG. 2